(12) United States Patent
Dougherty

(10) Patent No.: US 8,213,138 B2
(45) Date of Patent: Jul. 3, 2012

(54) CIRCUIT BREAKER WITH ARC FAULT DETECTION AND METHOD OF OPERATION

(75) Inventor: John James Dougherty, Collegeville, PA (US)

(73) Assignee: General Electric Company, Schenectady, NY (US)

( * ) Notice: Subject to any disclaimer, the term of this patent is extended or adjusted under 35 U.S.C. 154(b) by 943 days.

(21) Appl. No.: 12/188,563

(22) Filed: Aug. 8, 2008

(65) Prior Publication Data

US 2010/0033888 A1 Feb. 11, 2010

(51) Int. Cl.
*H02H 3/08* (2006.01)
*G06F 17/10* (2006.01)
(52) U.S. Cl. ............... 361/42; 361/49; 361/5; 708/300
(58) Field of Classification Search .............. 361/42, 361/49, 5; 708/300
See application file for complete search history.

(56) References Cited

U.S. PATENT DOCUMENTS

| | | | | |
|---|---|---|---|---|
| 4,639,817 A * | 1/1987 | Cooper et al. | ............. | 361/62 |
| 5,359,696 A * | 10/1994 | Gerson et al. | ............. | 704/223 |
| 6,577,138 B2 * | 6/2003 | Zuercher et al. | ............. | 324/536 |
| 7,368,918 B2 * | 5/2008 | Henson et al. | ............. | 324/536 |
| 7,773,358 B2 * | 8/2010 | Neesgaard et al. | ............. | 361/93.1 |

FOREIGN PATENT DOCUMENTS

JP 63220978 * 9/1988

* cited by examiner

*Primary Examiner* — Rexford Barnie
*Assistant Examiner* — Zeev V Kitov
(74) *Attorney, Agent, or Firm* — Cantor Colburn LLP

(57) ABSTRACT

A circuit breaker having a series arc fault detector and method of operation is provided. The series arc fault detector measures the RMS current and monitors current stability in response to a change in current levels. The sensitivity of the series arc fault detection is changed in response to the current satisfying a stability criterion. The circuit breaker further enables and disables series arc fault detection based on an enable threshold. The enable threshold is set based on the level of sensitivity being used to detect a series arc fault.

8 Claims, 9 Drawing Sheets

Startup Enable

Startup Enable

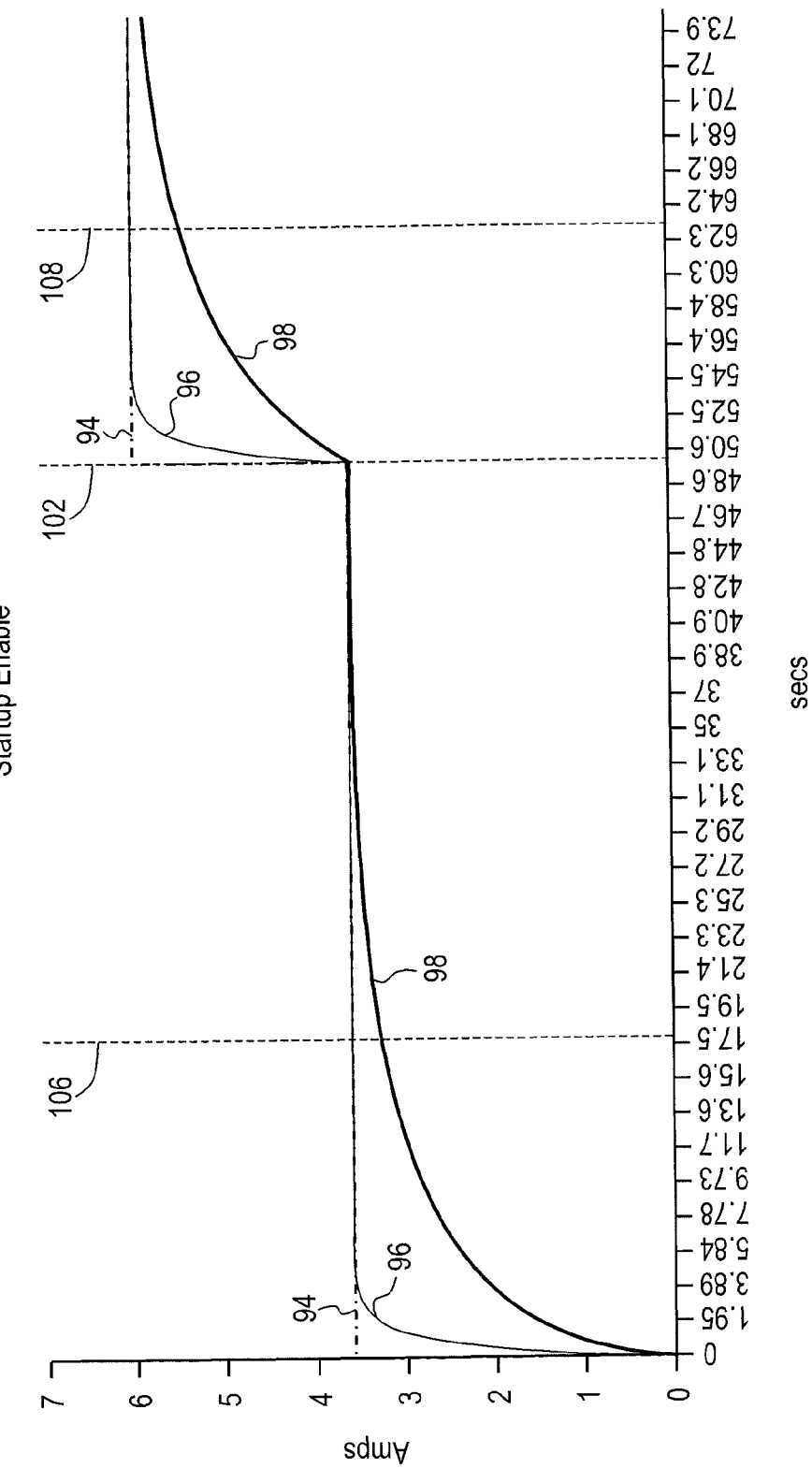

CIRCUIT BREAKER WITH ARC FAULT DETECTION AND METHOD OF OPERATION

BACKGROUND OF THE INVENTION

The subject matter disclosed herein relates to a circuit breaker having a series arc fault detector and method of operation. In particular, the subject matter disclosed herein relates to a series arc fault detector and method of operation where the sensitivity level and enable threshold for detection of a series arc fault may be changed in response to changed operational conditions.

A parallel arc is a type of electrical fault that can occur as a short circuit or a ground fault. A short circuit arc decreases the dielectric strength of insulation separating the electrical conductors, allowing a high-impedance, low-current arc fault to develop. Over time the arc carbonizes the conductor's insulation causing further decreases in the dielectric strength of insulation that separates the electrical conductors. The result is increased current and greatly increased thermal energy. During a short circuit, the system impedance and the impedance of the arc fault itself limit the current flow through a parallel arc fault.

In contrast, a series arc fault is a type of fault that can occur when an electrical conductor in series with a load is unintentionally broken. For example, a frayed conductor in a cord that has pulled apart, a loose connection to a receptacle or a loose connection in a splice. A series arc is load limited, meaning that the arc current cannot be greater than the load the electrical conductor serves. The current that flows through an arc in series has a lower root mean square (RMS) value than current without the arc due to extinction and re-ignition.

Due to the lower levels of RMS current that occur in series arc fault, detecting the presence of the series arc is difficult. In addition, the series arc must also be differentiated from electrical arcs that are normally generated by common household appliances, such as vacuum cleaners, hand drills and light switches for example. Unfortunately, due to the wide variety and conditions that may occur in a residential electrical circuit, series arc fault detectors have a high level of false positive detections that tend to result in undesirable nuisance tripping of the circuit breaker.

Series arc fault detection methodologies typically involve the interrogation of certain frequencies in the electrical current. Typically, a microprocessor monitors these frequencies and increments a counter when the suspect frequencies are detected. The frequencies are compared against a threshold, such as the number of frequency peaks accumulated during a period of time for example. Once the threshold is exceeded, the circuit breaker opens and provides an indication to the operator that a series arc fault has been detected. Other detection methods use wavelet onset time domain methodologies. These wavelet methods generally determine the duration of a half cycle of the current and determine if time durations measured between successive pairs of the wavelets during a predetermined time period match multiples of the duration of the half cycle of the current. In either of these methods, the sensitivity of the arc fault detector may be changed by modification of the detection algorithm parameters and the thresholds.

Series arc fault detectors are typically tested under procedures promulgated by a standards agency or body, such as Underwriters Laboratory (UL) procedure 1699 for example. Under these procedures, the detector needs to detect a series arc when the current passing through the circuit breaker is 5 amps or above. However, manufactures typically lower their detection threshold to 3.5 amps in order to assure compliance with the testing procedures.

Commercially available arc fault detectors are usually set to a high level of sensitivity to avoid missing a potential series arc fault. It should be appreciated that the number of appliances and conditions that the circuit breakers are exposed to in the field is large, and since circuit breakers usually operate 24 hours a day, seven days a week, the opportunity for a condition that looks like a series arc fault to the detector is high. When a false positive detection is generated, the circuit breaker is unnecessarily tripped causing a loss of power to the protected circuit.

While existing circuit breakers are suitable for their intended purposes, there still remains a need for improvements particularly reliability of detecting series arcs and reduction of nuisance tripping of the circuit breaker.

SUMMARY OF THE INVENTION

A method of detecting series arc fault is provided that includes the step of determining the current through a circuit breaker. It is determined if there is a change in the RMS current that exceeds a first threshold. A series arc fault detection sensitivity level is set at a first sensitivity level. Finally, the series arc fault detection sensitivity level is changed to a second sensitivity level if the current satisfies a first stability criterion.

A method of operating a circuit breaker to detect a series arc fault is also provided. The method includes the monitoring of an current flowing through the circuit breaker. A series arc fault detection sensitivity level is increased if a change in the current is greater than a first threshold. A first stability criterion is monitored after increasing the series arc fault detection sensitivity. The series arc fault detection sensitivity is then decreased if said first stability criterion meets a second threshold.

A circuit breaker is also provided. The circuit breaker includes a current sensor for measuring an electrical current through the circuit breaker. A trip unit is electrically coupled to the current sensor. The trip unit further includes a processor responsive to executable computer instructions when executed on the processor for detecting a series arc fault. The processor is further responsive for detecting the series arc fault at a first sensitivity level when the measured current satisfies a first stability criterion and at a second sensitivity level the measured current satisfies a second stability criterion.

BRIEF DESCRIPTION OF THE DRAWINGS

Referring now to the drawings, which are meant to be exemplary and not limiting, and wherein like elements are numbered alike.

DETAILED DESCRIPTION

Figure 1:
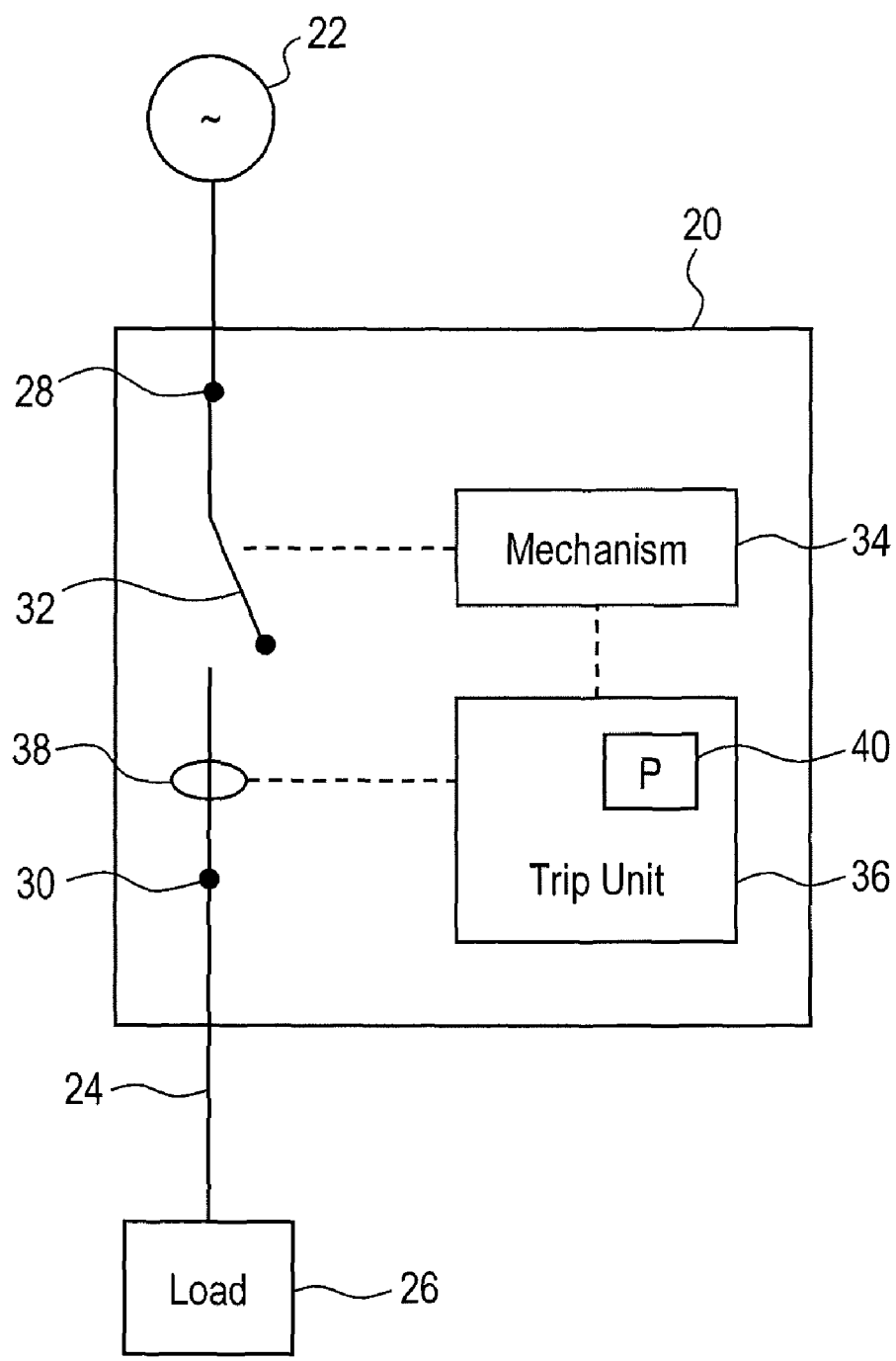
FIG. 1 is a schematic view illustration of a circuit breaker system having a series arc fault detector in accordance with an exemplary embodiment.

A circuit breaker having a series arc fault detector provides protection against electrical conditions that may arise due to a loose connection for example. One embodiment of such a circuit breaker 20 is illustrated in FIG. 1. The circuit breaker 20 is coupled between a power source 22 and a protected circuit 24. One or more loads 26 are coupled to the circuit 24. The circuit 24 may be located in a residential facility, for example, and the loads 26 may include any typical household appliances such as vacuum cleaners, electric tools, and drills. Some of the loads 26 may, as a normal part of their operation, generate an arc. For example, appliances that use motors, such as a series universal DC motor, will typically generate an arc between the rotor and a brush coupled to the stator. The circuit breaker 20 needs to distinguish between an arc produced by a series arc fault and an arc generated by an appliance.

The circuit breaker 20 includes an input terminal 28 that couples to the power source 22 and an output terminal 30 that couples to the circuit 24. An interrupter mechanism 32 is electrically coupled between the input terminal 28 and the output terminal 30. The interrupter mechanism 32 is capable of moving between a connected state, where electrical current flows through the circuit breaker and an open state where no electrical current flows to the circuit 24. The interrupter 32 typically includes a pair of separable contacts and a movable arm as is well known in the art. A mechanism 34 is coupled to the interrupter 32 to move the interrupter 32 between the connected state and the open state. The mechanism 34 will typically include a plurality of linkages and springs that are arranged to rapidly actuate the interrupter 32 in response to an operator manually actuating a handle (not shown) or due to a signal from a trip unit 36.

The trip unit 36 is electrically coupled to receive a signal from a sensor 38, such as a current transformer or a bimetal device used as a resistive shunt for example. The current transformer 38, as is well known in the art, generates a signal that is proportional to electrical current flowing through the circuit breaker 20. A processor 40 receives the signal from the current transformer 38. The processor 40 is a suitable electronic device capable of accepting data and instructions, executing the instructions to process the data, presenting the results and executing further actions based on the results. Processor 40 may accept instructions through a user interface, or through other means such as but not limited to electronic data cards, voice activation means, manually operable selection and control means, radiated wavelength and electronic or electrical transfer. Processor 40 can be a microprocessor, microcomputer, a minicomputer, an optical computer, a board computer, a complex instruction set computer, an ASIC (application specific integrated circuit), a reduced instruction set computer, an analog computer, a digital computer or a hybrid of any of the foregoing.

Figure 2:
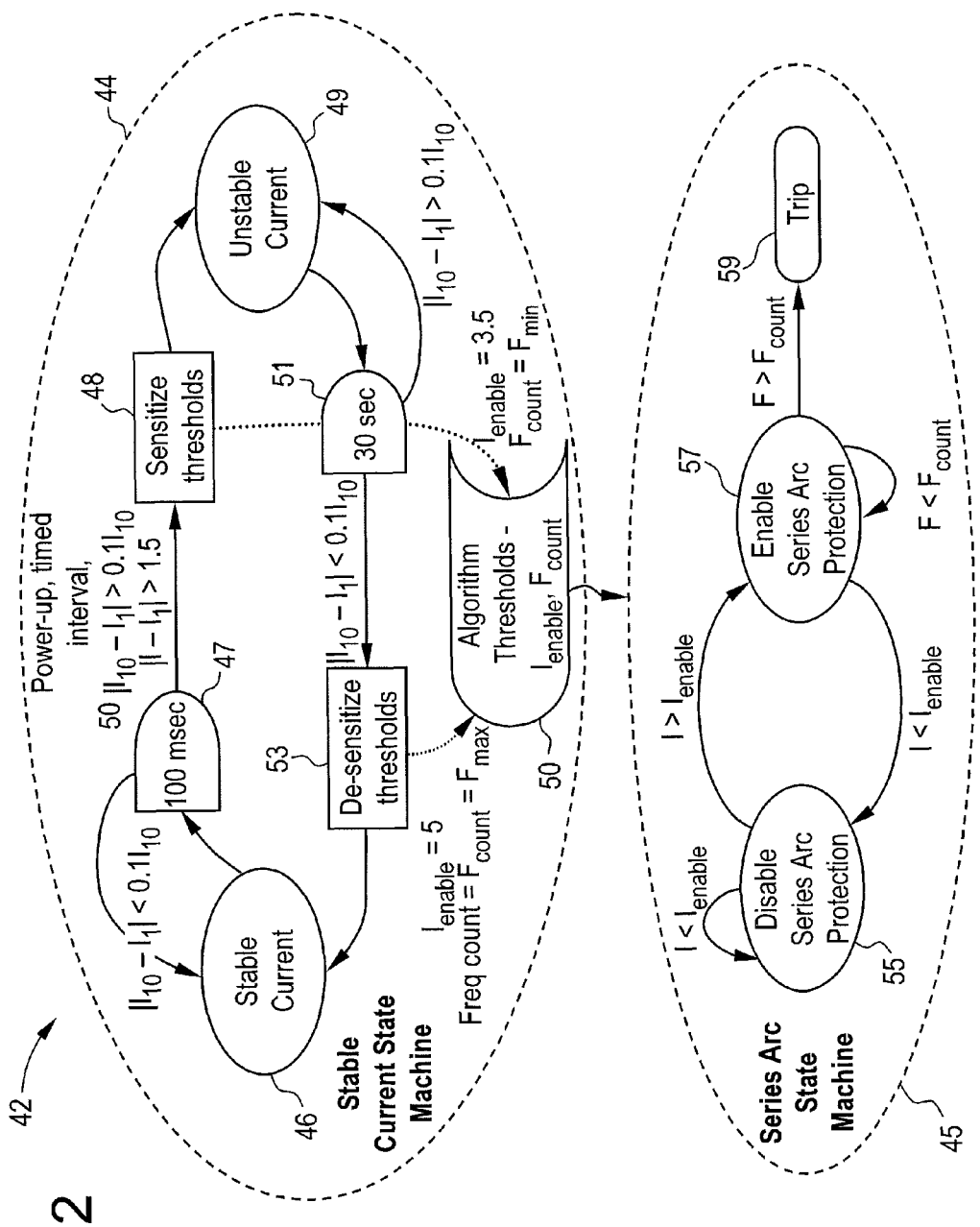
FIG. 2 is a schematic state diagram illustration of the series arc fault detector of FIG. 1.
Figure 3:
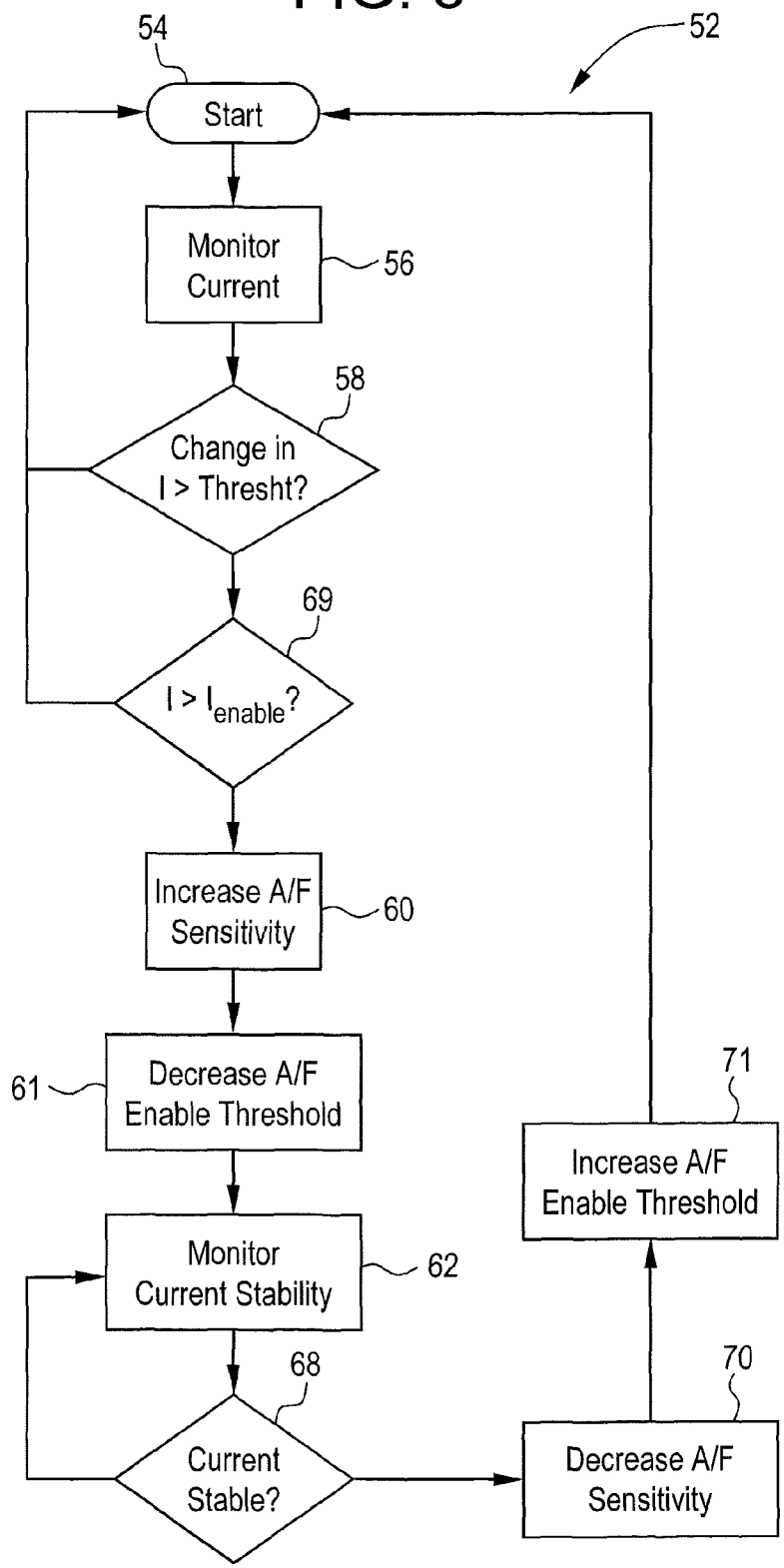
FIG. 3 is a flow chart of a method of operation for an embodiment of the series arc fault detector of FIG. 1.
Figure 4:
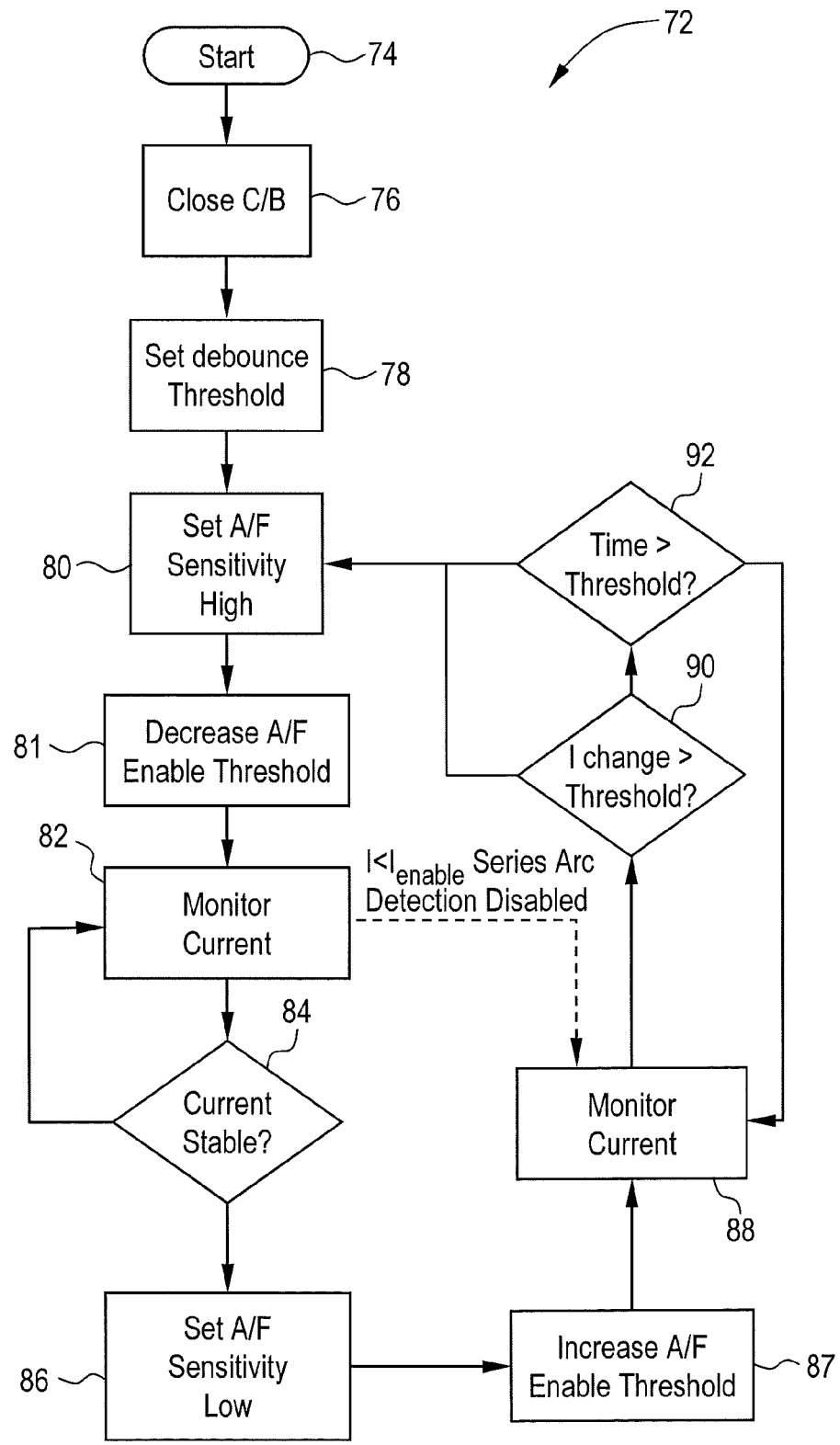
FIG. 4 is a flow chart for a method of operation for another embodiment of the series arc fault detector of FIG. 1.

The processor 40 includes methods to monitor the operation of the circuit breaker 20, such as those illustrated in FIGS. 2-4 for example, and determine if an undesired electrical condition may exist on the circuit 24. These methods are embodied in computer instructions written to be executed by processor 40, typically in the form of software. The software can be encoded in any language, including, but not limited to, assembly language, VHDL (Verilog Hardware Description Language), VHSIC HDL (Very High Speed IC Hardware Description Language), Fortran (formula translation), C, C++, Visual C++, Java, ALGOL (algorithmic language), BASIC (beginners all-purpose symbolic instruction code), visual BASIC and any combination or derivative of at least one of the foregoing.

Undesirable electrical conditions include, but are not limited to, short circuits, long time elevated current flow, short time elevated current flow, parallel arc faults and series arc faults. The trip unit 36 may also include associated hardware and electrical circuits that cooperate with the processor 40, such as read-only memory (ROM), random-access memory (RAM), and non-volatile memory (NVM) for example. It should be appreciated that the computer instructions and application code embodying the methods used by the processor 40 may be stored in ROM, RAM or NVM and executed when desired.

Referring now to FIGS. 2-4, a method of operating a series arc fault detector that improves the reliability of arc fault detection is described. Typical commercially available arc fault detectors operate at a single detection level. These detectors fail to take into account that if a series arc fault is not detected within a short period of time, after turning on the circuit breaker for example, that the series arc will not occur unless some other detectable event also occurs. The methods described herein provide a variable sensitivity series arc fault detector that changes the sensitivity of the arc fault detector in response to changes in operating conditions. By not maintaining the arc fault detector at high sensitivity levels during all periods of operation, the reliability of the circuit breaker operation is improved.

The operation of the arc fault detection method 42 can be considered as having different states such as a stable current state machine 44 and a series arc state machine 45 as illustrated in FIG. 2. It should be appreciated that the stable current state machine 44 and series arc state machine can operate simultaneously on the trip unit 36. The stable current state machine 44 monitors for current stability and changes the operation of the series arc detection based on the detected stability. When the measured current meets a threshold condition, it is considered "stable" and the state machine 44 operates in stable current block 46. In the exemplary embodiment, the stability threshold is determined by comparing a short time filter current and the long time filter current against a predetermined ratio such as 10% for example. So, in the exemplary embodiment, if the absolute value of the long time filter current minus the short time filter current is less than 10%, the current is considered stable. The state machine 44 checks current stability a predetermined amount of time, such as every 100 milliseconds, as represented by delay block 47. The delay block 47 represents a debounce parameter that delays the determination of current stability to avoid transients that are often formed when there are changes in the loads but do not represent actual series arcs. This occurs in some electrical hardware, such as less expensive light switches for example, there is a large transient that results due to poorly designed switching mechanisms.

If the state machine 44 determines that there has been a state change condition, such as but not limited to the stability criteria not being satisfied, the switching of the circuit breaker to the on position, an expiration of a timed interval, or if the RMS current changes by more than a threshold, such as 1.5 amps for example, the state machine shifts to block 48 where the sensitivity thresholds for the series arc detection algorithms 50 are changed. In the exemplary embodiment, when the sensitivity thresholds include the current at which the series arc detection is enabled ($I_{enable}$) and the number of frequency counts ($F_{count}$) required before a series arc fault is detected. The enable current may be set to 3.5 amps and the frequency count to a minimum for example.

Once the sensitivity thresholds are changed in block 48, the state machine 44 shifts to unstable current block 49. Similar to stable current block 46, unstable current block 49 checks the measured current against the stability criteria. After a predetermined period, such as 30 seconds, set by delay block 51, the state machine 44 checks the measured current against the stability criterion. As above, the stability criterion is a based on a comparison of the short time filter current against the long time filter current. When the filtered currents are within 10%, the state machine 44 shifts to de-sensitize threshold block 53. Here, the thresholds for the detection algorithms 50 are set to lower or less sensitive levels. In the exemplary embodiment, the lower sensitivity thresholds are 5 amps for the enable current ($I_{enable}$) and the frequency count is set to a maximum level.

The series arc state machine 45 has three states of operation. The state machine 45 operates in parallel with the stable current state machine 44, however, the changes in the detection algorithm 50 thresholds may also change the operating parameters of state machine 45. The first state in state machine 45 is the disable block 55. The disable block 55 compares the measured RMS current against the enable current ($I_{enable}$). If the enable threshold is exceeded, such as a measured RMS current of 4 amps when the enable current is 3.5 amps (as set by sensitivity threshold block 48) for example, the state machine 45 shifts to enable block 57. As discussed above, a series arc is typically detected through the counting of signal peaks in certain frequency ranges. If the frequency count is greater than the frequency criterion ($F_{count}$), the state machine 45 shifts to trip block 59 where the circuit breaker 20 is tripped and the flow of electrical current is halted. If the frequency criterion ($F_{count}$) has not been exceeded, then the state machine 45 continues to monitor the frequencies until the measured RMS current falls below the enable current ($I_{enable}$) that would result in the state machine 45 looping back to the disable block 55. It should be appreciated that in some embodiments, the series arc detection algorithms continue to monitor operation when series arc detection has been disabled. Instead, in these embodiments, the trip functionality associated with the series arc detection is disabled.

Turning now to FIG. 3, one embodiment of the method of operating a series arc fault detector will be discussed. The method 52 starts in block 54 and then monitors the current in block 56. The method then proceeds to query block 58 where it is determined if the change in current is greater than a threshold. In the exemplary embodiment, the change threshold is 1.5 amps. Therefore, anytime there is a positive or negative 1.5 amp change in the current, query block 58 will return a positive response. If query block 58 returns a negative, the method 52 loops back to start block 54 and the process starts again.

If query block 58 returns a positive, method 52 proceeds to block 69, it is determined if the RMS current is greater than the enable threshold ($I_{enable}$). If the RMS current is below the enable threshold, then series arc detection has been disabled and the method 52 loops back to block 54. If query block 69 returns a positive, meaning that series arc detection is enabled, then method 52 proceeds to block 60 where the sensitivity of the arc fault detector is increased. As discussed above, known algorithms for arc fault detection operate at a sensitivity that is defined by the manufacturer. In the exemplary embodiment, the arc fault detection Block 60 changes the arc fault detection between a "high" sensitivity and a "low" sensitivity. It should be appreciated that additional levels of sensitivity may be incorporated without deviating from the scope of the claimed inventions. If should further be appreciated that the methods disclosed herein may be used with any arc fault detection algorithm having a sensitivity level that may be adjusted.

Figure 5:
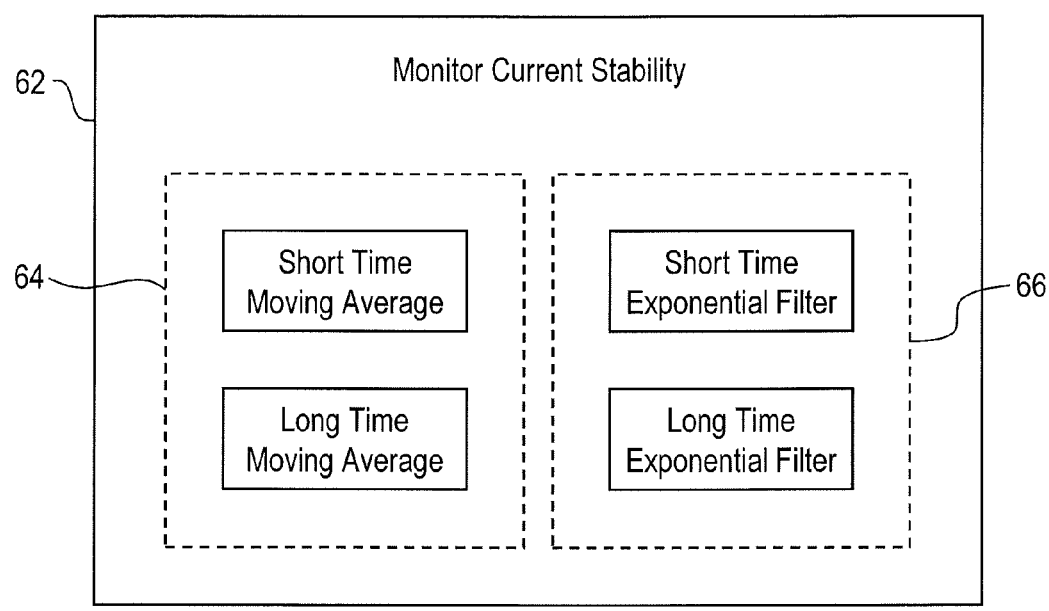
FIG. 5 is a block diagram illustration of a method for determining current stability for the method of operation illustrated in FIG. 3 and FIG. 4.

Since the change in current may indicate a potential circumstance where a fault occurred, this could result in a series arc fault being formed. For example, the change in current may be the result of an appliance such as a vacuum cleaner being turned on, or may be due to a momentary arcing caused by a worn extension cord. Therefore, block 60 sets the series arc fault detection sensitivity level to a high level and also lowers the series arc fault enable threshold in block 61. In the exemplary embodiment, the enable threshold is set to 3.5 amps when the detection sensitivity level is set to high, and 5.0 amps when the detection sensitivity level is set to low. Method 52 then proceeds on to block 62 where the method 52 monitors for current stability. Current stability is a parameter that may depend on a number of factors. In the exemplary embodiment, current stability is determined using a moving time average method 64, or an exponential filter method 66 as illustrated in FIG. 5. In one embodiment, the current stability either method 64, 66 is determined by simultaneously monitoring the current using a short time filter, having 1 second time constant, and a long time filter, having a 10 second time constant for example.

If both the short time filter and the long time filter currents are within a desired criteria ratio, such as the short time filter current is within 10% of the long time filter current, then the current is considered to be "stable". If the current is stable, the query block 68 will return a positive and the method 52 will proceed to block 70. In block 70, the series arc fault detection sensitivity is reduced to a "low" sensitivity level. If no arc fault has been detected once the current stabilizes, the probability of an arc fault occurring is also lower, therefore the sensitivity may be lowered to improve reliability and avoid nuisance trips. Once the sensitivity of the series arc fault detection is lowered, the series arc fault enable threshold is increased in block 71. The method 52 then loops back to start block 54 and process starts again. It should be appreciated that if series arcs are detected during the period when the series arc fault detection sensitivity is at the "high" level, the circuit breaker will trip and the flow of current will be interrupted.

Turning now to FIG. 4, another embodiment for detecting series arc faults is described. This method 72 begins in start block 74 and proceeds to block 76 where the circuit breaker 20 is closed, allowing electrical current to flow into the protected circuit 24. The method 72 sets a debounce limit, such as 100 milliseconds for example, in block 78. The debounce limit allows the series arc detector to avoid triggering based on irregularities in the waveform that can occur when contacts open or close, or when there is a sudden change in the current flow through the circuit breaker 20.

Next the method 72 proceeds on to set the series arc fault detection sensitivity to a high level in block 80 and decrease the enable threshold in block 81. The method 72 then monitors the current in block 82. If the current is below the enable current ($I_{enable}$), then series arc fault detection is disabled and the method 72 loops block 88 where the current is monitored as discussed below. While the current stabilizes in block 82, the series arc fault detector monitors for potential series arcs that may occur on the protected circuit. As discussed above, the potential for a series arc occurring without another electrically measurable event also occurring is low. Therefore, the method 72 monitors the current in block 82 for a defined period of time, such as 30 seconds for example, and when query block 84 returns an affirmative response, the current has stabilized and the potential for an existing series arc fault on the protected circuit 24 is low. The method then proceeds on to block 86 where the arc fault sensitivity is set to low and block 87 where the enable threshold is increased.

Method 72 next proceeds to block 88 where normal operation current monitoring is performed. The method 72 determines if the change in the flow of current through the circuit breaker 20 is greater than a threshold in query block 90. In the exemplary embodiment, the method 72 determines if there is a change of greater than 1.5 amps RMS in either the positive or negative directions. If such a change occurs, and the RMS current is above the enable threshold ($I_{enable}$), the method 72 loops back to block 80 where the series arc fault sensitivity is set to high.

If the query block 90 returns a negative, the method 72 proceeds to optional query block 92. Query block 92 determines if the amount of time the method 72 has been at low sensitivity is greater than a threshold. In the exemplary embodiment, the time threshold is 4 hours. If the query block 92 returns an affirmative, meaning that the threshold has been exceeded, the method 72 loops back to block 80 where the series arc fault sensitivity is set to high. Since a circuit breaker typically is turned on and then proceeds to operate for long periods of time without change, this allows for a periodic check of the protected circuit to ensure no new series arc faults have occurred that went undetected by the low sensitivity setting. If the query block 92 returns a negative, the method 72 continues to monitor the current in block 88.

EXAMPLE 1

Figure 6:
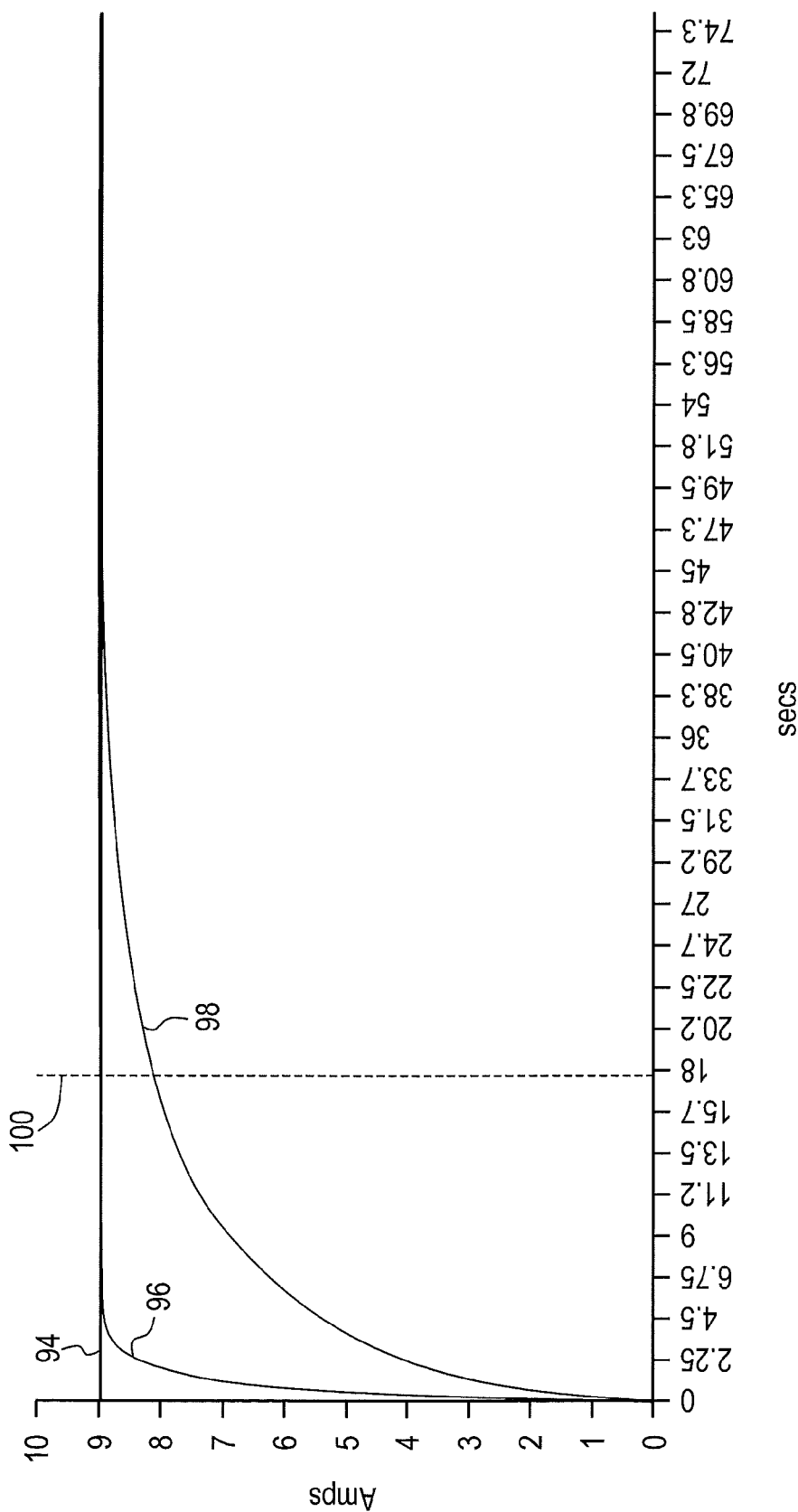
FIG. 6 is a current waveform illustration of a first example operation of the series arc fault detector of FIG. 1.

To further illustrate the operation of the series arc fault detector described above, a first example is illustrated by the simulated waveforms in FIG. 6. In this example, the circuit breaker 20 is switched to the on position and the RMS current increases from zero when the circuit breaker was off to 9 amps as shown by line 94. In this example, the series arc fault detection method also determines a short time moving average and a long time moving average shown by lines 96, 98 respectively. The short time moving average 96 is based on a 1 second time constant, while the long time moving average 98 is based on a 10 second time constant.

For exemplary purposes, current stability is defined as the short time moving average 96 being within 10% of the long time moving average 98. This stability criterion is met at approximately 16 seconds after the circuit breaker 20 was switched to the on position, as represented by line 100. At this point, assuming that a series arc fault is not detected, the series arc fault detector switches to a lower sensitivity level and higher enable threshold to avoid nuisance tripping.

EXAMPLE 2

Figure 7:
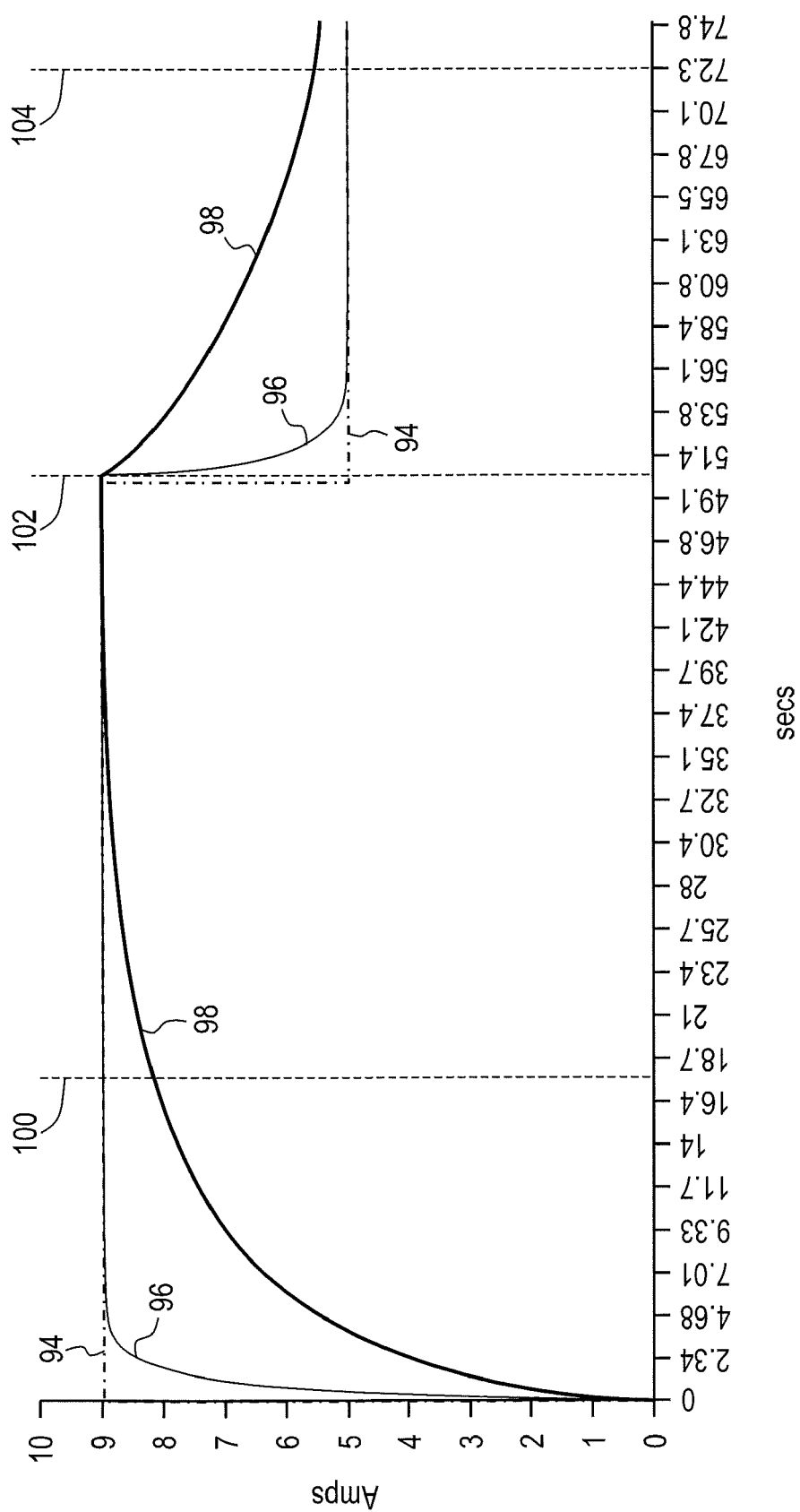
FIG. 7 is a current waveform illustration of a second example operation of the series arc fault detector of FIG. 1.

A second example is illustrated in FIG. 7. In this example, the circuit breaker 20 is switched to the on position and the RMS current once again increases to 9 amps. Similar to example 1, at approximately 16 second, the stability criterion is met and the series arc fault detector changes to a lower sensitivity at line 100. However, at approximately 50 seconds, represented by line 102, there is a drop transient in the RMS current from 9 amps to 5 amps. Since this change in the RMS current is greater than the change threshold of 1.5 amps, the sensitivity of the series arc fault detector is increased to a high level and the enable threshold is lowered.

As the short time moving average and long time moving average gradually converge to the RMS current, the stability criterion is once again met at approximately 72 seconds, as represented by line 104. Similar to above, once the stability criterion is met, the series arc fault detector sensitivity level is once again lowered and the enable threshold increased. It should be appreciated that in both example 1 and Example 2, the RMS current remained above series arc fault threshold for the activation of the series arc detection. Therefore, the series arc fault detector remained enabled for the entire duration of the examples.

EXAMPLE 3

Figure 8:
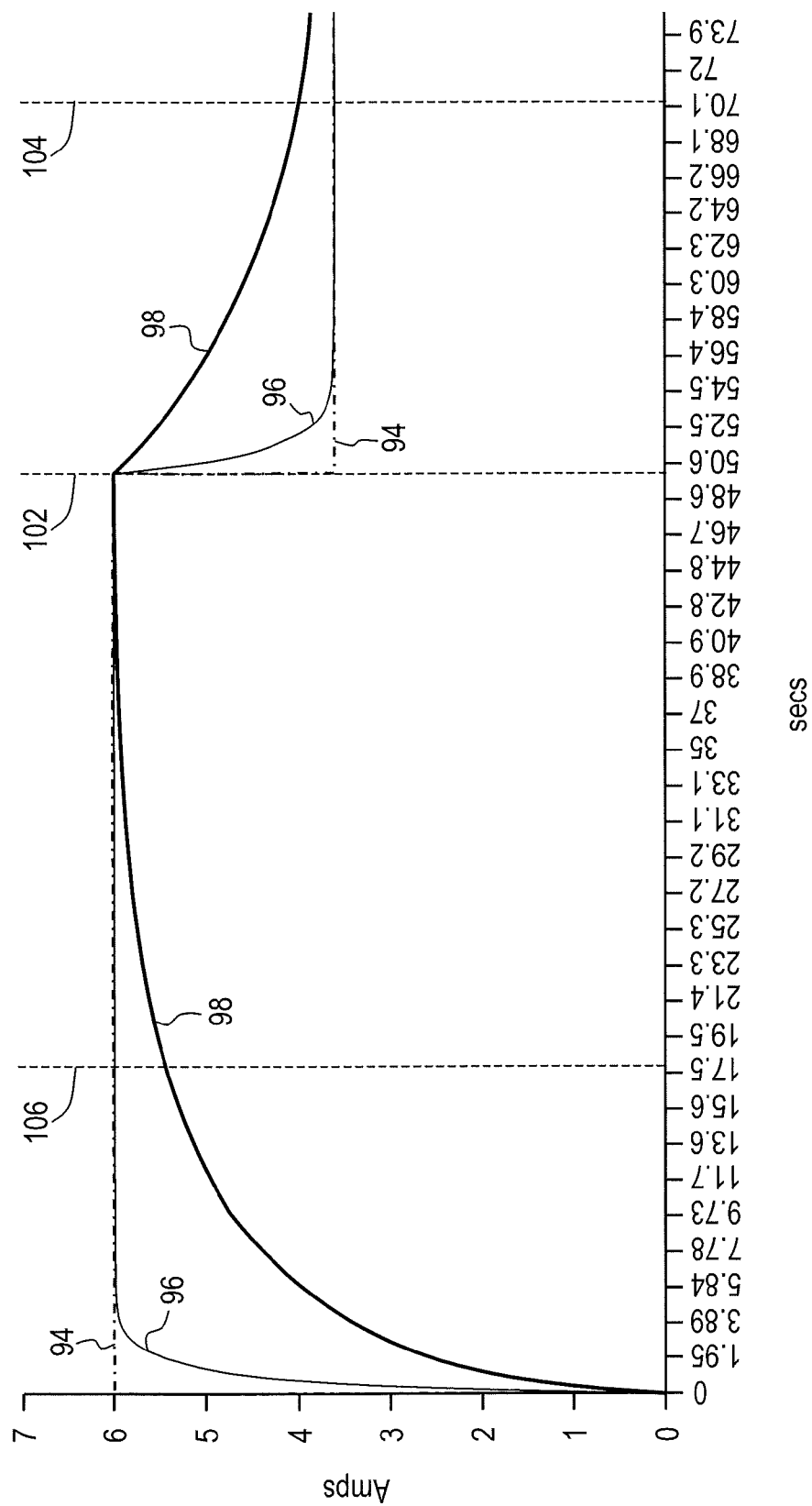
FIG. 8 is a current waveform illustration of a third example operation of the series arc fault detector of FIG. 1; and, FIG. 9 is a current waveform illustration of a fourth example operation of the series arc fault detector of FIG. 1.

In Example 3 illustrated in FIG. 8, the circuit breaker 20 once again is switched to the on position and the current increases to 6 amps. At approximately 17 seconds, as represented by line 106, the current stability criterion is satisfied and the series arc fault detection sensitivity is lowered. At approximately 50 seconds, represented by line 102, the transient RMS current drops to approximately 3.5 amps. As above, this causes the series arc fault sensitivity to be increased until the current stability criterion is once again satisfied at approximately 70 seconds (line 104).

When the current once again stabilizes, the RMS current is at approximately 3.5 amps. As discussed above, the series arc fault standards have defined a threshold of 5 amps before series arc fault needs to be enabled. While commercially available series arc fault detectors typically set this enablement threshold at 3.5 amps to ensure compliance with UL1699, the embodiments disclosed herein set the enablement threshold at 3.5 amps only when the detection sensitivity is also set to high. When the detector sensitivity is set to low, this enablement threshold is increased to 5 amps. Therefore, once the current stabilizes at approximately 70 seconds, the enablement threshold for series arc detection increases to 5 amps, which is above the RMS current flowing through the circuit breaker 20. Therefore, the series arc detector is disabled after the 70-second point, at least until another current change results in a change in the sensitivity level.

EXAMPLE 4

The final example is Example 4 illustrated in FIG. 9. This example demonstrates the enabling and disabling of the series arc fault detection in conjunction with the changing of the detector sensitivity. In this example, the RMS current 94 increases from zero, when the circuit breaker 20 is switched to the on position, to approximately 3.5 amps. At this point, the series arc fault detector is enabled and the detector sensitivity is set to high. The current stability criterion is satisfied at approximately 17 seconds as represented by line 106. Once the current is stabilized, the detector sensitivity is set to low and the enable threshold is increased to 5 amps. Since the RMS current is only 3.5 amps, the series arc fault detector is disabled.

Subsequently, at approximately 50 seconds, represented by line 102, the transitory RMS current increases to 6 amps. This increases triggers the current change threshold of 1.5 amps. Therefore, the series arc fault detector is enabled with the detector sensitivity set to high. At approximately 63 seconds, represented by line 108, the current stability criterion is once again satisfied and the detector sensitivity is switched to low and the enable threshold increased to 5 amps. However, since the RMS current remains at 6 amps, the series arc fault detector remains enabled.

It should be appreciated that the current stability criterion discussed above is for exemplary purposes and not intended to be limiting. For example, different types of filters may be used instead of the moving average. Also, different metrics other than the short time filter being within 10% of the long time filter may be used. Further, under some circumstances, such as to ease computational burdens on the processor 40 for example, it may be desirable to utilize only a single filter.

It should be appreciated that the current stability criterion discussed above is for exemplary purposes. During startup, at regular time intervals and after the detection of instability, an optional time delay may be performed to retain high sensitivity and low current enable threshold for a minimum period such as 30 seconds as described in time delay 51 in reference to FIG. 2. However, this additional time delay 51 is not reflected in the graphs illustrated in FIGS. 6-9.

It should further be appreciated that the series arc fault detector arrangement provides a number of advantages to improve reliability and reduce nuisance tripping of the circuit breaker 20. The series arc fault detector reduces the sensitivity of the detector during times where there is a low probability of a series arc fault occurring. The series arc fault detector also automatically enables and disables the series arc fault detector in response to changing conditions on the protected circuit to further reduce the opportunity for a false positive detection of a series arc fault.

Further, an embodiment of the invention may be embodied in the form of computer-implemented processes and apparatuses for practicing those processes. The present invention may also be embodied in the form of a computer program product having computer program code containing instructions embodied in tangible media, such as floppy diskettes, CD-ROMs, hard drives, USB (universal serial bus) drives, or any other computer readable storage medium, such as random access memory (RAM), read only memory (ROM), or erasable programmable read only memory (EPROM), for example, wherein, when the computer program code is loaded into and executed by a computer, the computer becomes an apparatus for practicing the invention. The present invention may also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein when the computer program code is loaded into and executed by a computer, the computer becomes an apparatus for practicing the invention. When implemented on a general-purpose microprocessor, the computer program code segments configure the microprocessor to create specific logic circuits. A technical effect of the executable instructions is to provide a series arc fault detection method that utilizes multiple sensitivity levels based on operating conditions.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims. Examples include measurement of current by averaging or peak detection or Fourier analysis of the fundamental waveform. Current stability can be measured by a number of filtering and periodic sampling algorithms, which would serve essentially the same purpose. The current thresholds of 5 amperes and 3.5 amperes may be modified to different values. In addition, an algorithm with multiple current thresholds (more than 2) and scaled levels of series arc enabling and sensitivity can also be employed. The specific debouncing and other fixed time thresholds for delays listed in this embodiment may also be modified. All of these modifications would be obvious to one skilled in the art and are included within the scope of the claims.

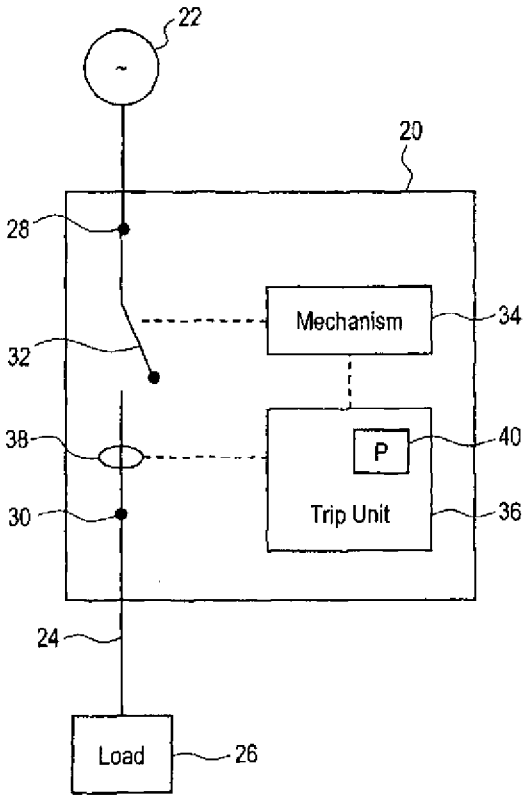

What is claimed is:

1. A circuit breaker comprising:
   a current sensor for measuring an electrical current through said circuit breaker; and,
   a trip unit electrically coupled to said current sensor, said trip unit further having a processor responsive to executable computer instructions when executed on the processor for detecting a series arc fault, said processor is further responsive for detecting said series arc fault at a first sensitivity level when said measured current satisfies a first stability criterion and at a second sensitivity level when said measured current satisfies a second stability criterion.

2. The circuit breaker of claim 1 wherein:
   said processor is further responsive to executable computer instructions for calculating an RMS current from said measured current; and,
   said processor is further responsive to executable computer instructions for switching to detect said series arc fault at said first sensitivity level if a change in said calculated RMS current exceeds a first threshold.

3. The circuit breaker of claim 2 wherein said processor is further responsive to executable computer instructions for disabling said series arc fault detection if said current satisfies said second stability criterion and said RMS current is below a first threshold.

4. The circuit breaker of claim 3 wherein said processor is further responsive to executable computer instructions for determining if said measured current satisfies said first stability criterion by calculating a first current parameter and a second current parameter.

5. The circuit breaker of claim 4 wherein said first current parameter is a current level determined using a first moving time average and said second current parameter is determined using a second moving time average.

6. The circuit breaker of claim 4 wherein said first current parameter is a current level determined using a first exponential filter and said second current parameter is determined using a second exponential filter.

7. The circuit breaker of claim 6 wherein said processor is further responsive to executable computer instructions for determining if said measured current satisfies said second level stability criterion if the ration of said a first current parameter to said second current parameter is less than a predetermined threshold.

8. The circuit breaker of claim 7 wherein said processor is further responsive to executable computer instructions for setting a debounce parameter in response to a change in said calculated RMS current exceeding said first threshold, and wherein said detecting of said series arc fault is delayed until said debounce parameter is satisfied.

* * * * *

UNITED STATES PATENT AND TRADEMARK OFFICE
CERTIFICATE OF CORRECTION

PATENT NO.         : 8,213,138 B2
APPLICATION NO.    : 12/188563
DATED              : July 3, 2012
INVENTOR(S)        : Dougherty It is certified that error appears in the above-identified patent and that said Letters Patent is hereby corrected as shown below:

In col. 10, Lines 16-65, delete

1. A circuit breaker comprising:

a current sensor for measuring an electrical current through said circuit breaker; and, a trip unit electrically coupled to said current sensor, said trip unit further having a processor responsive to executable computer instructions when executed on the processor for detecting a series arc fault, said processor is further responsive for detecting said series arc fault at a first sensitivity level when said measured current satisfies a first stability criterion and at a second sensitivity level when said measured current satisfies a second stability criterion.

2. The circuit breaker of Claim 1 wherein:

said processor is further responsive to executable computer instructions for calculating an RMS current from said measured current; and, said processor is further responsive to executable computer instructions for switching to detect said series arc fault at said first sensitivity level if a change in said calculated RMS current exceeds a first threshold.

3. The circuit breaker of Claim 3 wherein said processor is further responsive to executable computer instructions for disabling said series arc fault detection if said current satisfies said second stability criterion and said RMS current is below a first threshold.

"    4. The circuit breaker of Claim 4 wherein said processor is further responsive to Signed and Sealed this
Sixth Day of November, 2012

David J. Kappos
*Director of the United States Patent and Trademark Office*

CERTIFICATE OF CORRECTION (continued)
U.S. Pat. No. 8,213,138 B2 executable computer instructions for determining if said measured current satisfies said first stability criterion by calculating a first current parameter and a second current parameter.

5. The circuit breaker of Claim 4 wherein said first current parameter is a current level determined using a first moving time average and said second current parameter is determined using a second moving time average.

6. The circuit breaker of Claim 4 wherein said first current parameter is a current level determined using a first exponential filter and said second current parameter is determined using a second exponential filter.

7. The circuit breaker of Claim 6 wherein said processor is further responsive to executable computer instructions for determining if said measured current satisfies said second level stability criterion if the ration of said a first current parameter to said second current parameter is less than a predetermined threshold.

8. The circuit breaker of Claim 7 wherein said processor is further responsive to executable computer instructions for setting a debounce parameter in response to a change in said calculated RMS current exceeding said first threshold, and wherein said detecting of said series arc fault is delayed until said debounce parameter is satisfied.

and insert

1. A method of detecting series arc fault comprising:
determining a current through a circuit breaker;
determining if a change in said current exceeds a first threshold;
setting a series arc fault detection sensitivity level at a first sensitivity level; and,
changing said series arc fault detection sensitivity level to a second sensitivity level if said current satisfies a first stability criteria.

2. The method of Claim 1 further comprising:
changing said series arc fault detection sensitivity level to a second sensitivity level if said monitor current meets said first stability criteria and a second stability criteria.

3. The method of Claim 2 wherein said first stability criteria is determined by monitoring a first filtered current and said second stability criteria is determined by monitoring a second filtered current.

4. The method of Claim 3 wherein said first filtered current is determined based on a first moving time average, and said second filtered current is determined based on a second moving time average, wherein a time constant associated with said first filtered current is greater than a time constant associated with said second filtered current.

5. The method of Claim 3 wherein said first filtered current is determined based on a first exponential filter and said second filtered current is determined based on a second exponential filter, wherein a time constant associated with said first filtered current is greater than a time constant associated with said second filtered current.

6. The method of Claim 1 further comprising:

monitoring the amount of time said series arc fault detection sensitivity level has been set to said second sensitivity level; and, setting said series arc fault detection sensitivity level to said first sensitivity level if said amount of time exceeds a time threshold.

7. The method of Claim 1 further comprising changing an enable threshold from a first current limit to a second current limit in response to said series arc fault sensitivity being changed to said second sensitivity level.

8. A method of operating a circuit breaker to detect a series arc fault comprising:

monitoring a current flowing through said circuit breaker;

increasing a series arc fault detection sensitivity if a change in said current is greater than a first threshold;

monitoring a first stability criterion after increasing said series arc fault detection sensitivity; and, decreasing said series arc fault detection sensitivity if said first stability criterion meets a second threshold.

9. The method of Claim 8 further comprising the step of monitoring a second stability criterion after increasing said series arc fault detection sensitivity.

10. The method of Claim 9 wherein said first stability criterion is a measured current level modified by a first exponential filter and said second stability criterion is said measured current level modified by a second exponential filter, wherein said first exponential filter has a longer time constant than said second exponential filter.

11. The method of Claim 9 wherein said first stability criterion is a measured current level modified by a first moving average filter and said second stability criterion is said current level modified by a second moving average filter, wherein said first moving average filter has a longer time constant than said second moving average filter.

12. The method of Claim 9 further comprising the setting of a debounce criteria, wherein said increase in said series arc fault sensitivity occurs after said debounce criteria has been satisfied.

13. A circuit breaker comprising:

a current sensor for measuring an electrical current through said circuit breaker; and, a trip unit electrically coupled to said current sensor, said trip unit further having a processor responsive to executable computer instructions when executed on the processor for detecting a series arc fault, said processor is further responsive for detecting said series arc fault at a first sensitivity level when said measured current satisfies a first stability criterion and at a second sensitivity level when said measured current satisfies a second stability criterion.

14. The circuit breaker of Claim 13 wherein:

said processor is further responsive to executable computer instructions for calculating an RMS current from said measured current; and, said processor is further responsive to executable computer instructions for switching to detect said series arc fault at said first sensitivity level if a change in said calculated RMS current exceeds a first threshold.

15. The circuit breaker of Claim 14 wherein said processor is further responsive to executable computer instructions for disabling said series arc fault detection if said current satisfies said second stability criterion and said RMS current is below a first threshold.

16. The circuit breaker of Claim 15 wherein said processor is further responsive to executable computer instructions for determining if said measured current satisfies said first stability criterion by calculating a first current parameter and a second current parameter.

17. The circuit breaker of Claim 16 wherein said first current parameter is a current level determined using a first moving time average and said second current parameter is determined using a second moving time average.

18. The circuit breaker of Claim 16 wherein said first current parameter is a current level determined using a first exponential filter and said second current parameter is determined using a second exponential filter.

19. The circuit breaker of Claim 18 wherein said processor is further responsive to executable computer instructions for determining if said measured current satisfies said second level stability criterion if the ration of said a first current parameter to said second current parameter is less than a predetermined threshold.

20. The circuit breaker of Claim 19 wherein said processor is further responsive to executable computer instructions for setting a debounce parameter in response to a change in said calculated RMS current exceeding said first threshold, and wherein said detecting of said series arc fault is delayed until said debounce parameter is satisfied.

-- therefor.

UNITED STATES PATENT AND TRADEMARK OFFICE
CERTIFICATE OF CORRECTION

PATENT NO. : 8,213,138 B2
APPLICATION NO. : 12/188563
DATED : July 3, 2012
INVENTOR(S) : Dougherty It is certified that error appears in the above-identified patent and that said Letters Patent is hereby corrected as shown below:

Delete the title page and substitute therefor the attached title page showing the corrected number of claims in patent.

In col. 10, Lines 16-65, delete

"   1. A circuit breaker comprising:

a current sensor for measuring an electrical current through said circuit breaker; and, a trip unit electrically coupled to said current sensor, said trip unit further having a processor responsive to executable computer instructions when executed on the processor for detecting a series arc fault, said processor is further responsive for detecting said series arc fault at a first sensitivity level when said measured current satisfies a first stability criterion and at a second sensitivity level when said measured current satisfies a second stability criterion.

2. The circuit breaker of Claim 1 wherein:

said processor is further responsive to executable computer instructions for calculating an RMS current from said measured current; and, said processor is further responsive to executable computer instructions for switching to detect said series arc fault at said first sensitivity level if a change in said calculated RMS current exceeds a first threshold.

3. The circuit breaker of Claim 3 wherein said processor is further responsive to executable computer instructions for disabling said series arc fault detection if said current satisfies said second stability criterion and said RMS current is below a first threshold.

4. The circuit breaker of Claim 4 wherein said processor is further responsive to This certificate supersedes the Certificate of Correction issued November 6, 2012.

Signed and Sealed this
Eleventh Day of December, 2012

David J. Kappos
*Director of the United States Patent and Trademark Office*

CERTIFICATE OF CORRECTION (continued)
U.S. Pat. No. 8,213,138 B2 executable computer instructions for determining if said measured current satisfies said first stability criterion by calculating a first current parameter and a second current parameter.

5. The circuit breaker of Claim 4 wherein said first current parameter is a current level determined using a first moving time average and said second current parameter is determined using a second moving time average.

6. The circuit breaker of Claim 4 wherein said first current parameter is a current level determined using a first exponential filter and said second current parameter is determined using a second exponential filter.

7. The circuit breaker of Claim 6 wherein said processor is further responsive to executable computer instructions for determining if said measured current satisfies said second level stability criterion if the ration of said a first current parameter to said second current parameter is less than a predetermined threshold.

8. The circuit breaker of Claim 7 wherein said processor is further responsive to executable computer instructions for setting a debounce parameter in response to a change in said calculated RMS current exceeding said first threshold, and wherein said detecting of said series arc fault is delayed until said debounce parameter is satisfied. „ and insert

1. A method of detecting series arc fault comprising:
determining a current through a circuit breaker;
determining if a change in said current exceeds a first threshold;
setting a series arc fault detection sensitivity level at a first sensitivity level; and,
changing said series arc fault detection sensitivity level to a second sensitivity level if said current satisfies a first stability criteria.

2. The method of Claim 1 further comprising:
changing said series arc fault detection sensitivity level to a second sensitivity level if said monitor current meets said first stability criteria and a second stability criteria.

3. The method of Claim 2 wherein said first stability criteria is determined by monitoring a first filtered current and said second stability criteria is determined by monitoring a second filtered current.

4. The method of Claim 3 wherein said first filtered current is determined based on a first moving time average, and said second filtered current is determined based on a second moving time average, wherein a time constant associated with said first filtered current is greater than a time constant associated with said second filtered current.

5. The method of Claim 3 wherein said first filtered current is determined based on a first exponential filter and said second filtered current is determined based on a second exponential filter, wherein a time constant associated with said first filtered current is greater than a time constant associated with said second filtered current.

6. The method of Claim 1 further comprising:

monitoring the amount of time said series arc fault detection sensitivity level has been set to said second sensitivity level; and, setting said series arc fault detection sensitivity level to said first sensitivity level if said amount of time exceeds a time threshold.

7. The method of Claim 1 further comprising changing an enable threshold from a first current limit to a second current limit in response to said series arc fault sensitivity being changed to said second sensitivity level.

8. A method of operating a circuit breaker to detect a series arc fault comprising:

monitoring a current flowing through said circuit breaker;

increasing a series arc fault detection sensitivity if a change in said current is greater than a first threshold;

monitoring a first stability criterion after increasing said series arc fault detection sensitivity; and, decreasing said series arc fault detection sensitivity if said first stability criterion meets a second threshold.

9. The method of Claim 8 further comprising the step of monitoring a second stability criterion after increasing said series arc fault detection sensitivity.

10. The method of Claim 9 wherein said first stability criterion is a measured current level modified by a first exponential filter and said second stability criterion is said measured current level modified by a second exponential filter, wherein said first exponential filter has a longer time constant than said second exponential filter.

11. The method of Claim 9 wherein said first stability criterion is a measured current level modified by a first moving average filter and said second stability criterion is said current level modified by a second moving average filter, wherein said first moving average filter has a longer time constant than said second moving average filter.

12. The method of Claim 9 further comprising the setting of a debounce criteria, wherein said increase in said series arc fault sensitivity occurs after said debounce criteria has been satisfied.

13. A circuit breaker comprising:

a current sensor for measuring an electrical current through said circuit breaker; and, a trip unit electrically coupled to said current sensor, said trip unit further having a processor responsive to executable computer instructions when executed on the processor for detecting a series arc fault, said processor is further responsive for detecting said series arc fault at a first sensitivity level when said measured current satisfies a first stability criterion and at a second sensitivity level when said measured current satisfies a second stability criterion.

14. The circuit breaker of Claim 13 wherein:

said processor is further responsive to executable computer instructions for calculating an RMS current from said measured current; and, said processor is further responsive to executable computer instructions for switching to detect said series arc fault at said first sensitivity level if a change in said calculated RMS current exceeds a first threshold.

15. The circuit breaker of Claim 14 wherein said processor is further responsive to executable computer instructions for disabling said series arc fault detection if said current satisfies said second stability criterion and said RMS current is below a first threshold.

16. The circuit breaker of Claim 15 wherein said processor is further responsive to executable computer instructions for determining if said measured current satisfies said first stability criterion by calculating a first current parameter and a second current parameter.

17. The circuit breaker of Claim 16 wherein said first current parameter is a current level determined using a first moving time average and said second current parameter is determined using a second moving time average.

18. The circuit breaker of Claim 16 wherein said first current parameter is a current level determined using a first exponential filter and said second current parameter is determined using a second exponential filter.

19. The circuit breaker of Claim 18 wherein said processor is further responsive to executable computer instructions for determining if said measured current satisfies said second level stability criterion if the ration of said a first current parameter to said second current parameter is less than a predetermined threshold.

20. The circuit breaker of Claim 19 wherein said processor is further responsive to executable computer instructions for setting a debounce parameter in response to a change in said calculated RMS current exceeding said first threshold, and wherein said detecting of said series arc fault is delayed until said debounce parameter is satisfied.

-- therefor.

(12) United States Patent
Dougherty

(10) Patent No.: US 8,213,138 B2
(45) Date of Patent: Jul. 3, 2012

(54) CIRCUIT BREAKER WITH ARC FAULT DETECTION AND METHOD OF OPERATION

(75) Inventor: John James Dougherty, Collegeville, PA (US)

(73) Assignee: General Electric Company, Schenectady, NY (US)

(*) Notice: Subject to any disclaimer, the term of this patent is extended or adjusted under 35 U.S.C. 154(b) by 943 days.

(21) Appl. No.: 12/188,563

(22) Filed: Aug. 8, 2008

(65) Prior Publication Data
US 2010/0033888 A1 Feb. 11, 2010

(51) Int. Cl.
*H02H 3/08* (2006.01)
*G06F 17/10* (2006.01)
(52) U.S. Cl. .......... 361/42; 361/49; 361/5; 708/300
(58) Field of Classification Search .......... 361/42, 361/49, 5; 708/300
See application file for complete search history.

(56) References Cited

U.S. PATENT DOCUMENTS

| | | | |
|---|---|---|---|
| 4,639,817 A * | 1/1987 | Cooper et al. | 361/62 |
| 5,359,696 A * | 10/1994 | Gerson et al. | 704/223 |
| 6,577,138 B2 * | 6/2003 | Zuercher et al. | 324/536 |
| 7,368,918 B2 * | 5/2008 | Henson et al. | 324/536 |
| 7,773,358 B2 * | 8/2010 | Neesgaard et al. | 361/93.1 |

FOREIGN PATENT DOCUMENTS
JP 63220978 * 9/1988
* cited by examiner

*Primary Examiner* — Rexford Barnie
*Assistant Examiner* — Zeev V Kitov
(74) *Attorney, Agent, or Firm* — Cantor Colburn LLP

(57) ABSTRACT

A circuit breaker having a series arc fault detector and method of operation is provided. The series arc fault detector measures the RMS current and monitors current stability in response to a change in current levels. The sensitivity of the series arc fault detection is changed in response to the current satisfying a stability criterion. The circuit breaker further enables and disables series arc fault detection based on an enable threshold. The enable threshold is set based on the level of sensitivity being used to detect a series arc fault.

20 Claims, 9 Drawing Sheets